United States Patent
Donkers et al.

(10) Patent No.: US 9,331,155 B2
(45) Date of Patent: May 3, 2016

(54) SEMICONDUCTOR DEVICE AND MANUFACTURING METHOD

(71) Applicant: NXP B.V., Eindhoven (NL)

(72) Inventors: Johannes Donkers, Valkenswaard (NL); Hans Broekman, Nijmegen (NL); Stephan Heil, Eindhoven (NL); Mark De Keijser, Millingen aan de Rijn (NL); Cecilia van der Schaar, Beuningen (NL)

(73) Assignee: NXP B.V., Eindhoven (NL)

( * ) Notice: Subject to any disclaimer, the term of this patent is extended or adjusted under 35 U.S.C. 154(b) by 5 days.

(21) Appl. No.: 14/249,108

(22) Filed: Apr. 9, 2014

(65) Prior Publication Data

US 2014/0306232 A1  Oct. 16, 2014

(30) Foreign Application Priority Data

Apr. 15, 2013  (EP) .................................... 13163745

(51) Int. Cl.
  *H01L 49/02*  (2006.01)
  *H01L 29/205*  (2006.01)
  (Continued)

(52) U.S. Cl.
  CPC ........ *H01L 29/205* (2013.01); *H01L 21/28575* (2013.01); *H01L 21/28581* (2013.01); *H01L 29/452* (2013.01); *H01L 29/475* (2013.01); *H01L 29/66462* (2013.01); *H01L 29/7787* (2013.01); *H01L 29/2003* (2013.01)

(58) Field of Classification Search
  CPC ................ H01L 2924/01322; H01L 2924/00; H01L 33/62; H01L 2224/16; H01L 2224/73204; H01L 33/0079; H01L 33/22; H01L 33/32; H01L 33/38; H01L 33/382; H01L 33/40; H01L 33/46
  USPC ........................ 257/E33.066, E33.068, 80, 99
  See application file for complete search history.

(56) References Cited

U.S. PATENT DOCUMENTS 4,889,565 A * 12/1989  Fan ................. H01L 31/022425
                                                136/256
5,821,620 A * 10/1998  Hong ................ H01L 21/76838
                                                257/751

(Continued)

FOREIGN PATENT DOCUMENTS

DE  100 60 439 A1  6/2002
EP  0 402 061 A2  12/1990

(Continued)

OTHER PUBLICATIONS

Donkers, J. et al. "600 V-900 V GaN-on-Si Process Technology for Schottky Barrier Diodes and Power Switches Fabricated in a Standard Si-Production Fab", 16th CS Mantech, pp. 259-262 (2013).

(Continued)

*Primary Examiner* — Stephen W Smoot
*Assistant Examiner* — Edward Chin
(74) *Attorney, Agent, or Firm* — Rajeev Madnawat

(57) ABSTRACT

Disclosed is a semiconductor device comprising at least one active layer (14, 16) on a substrate (10) and a first contact (24, 26, 28) to the at least one active layer, the first contact comprising a metal in contact with the at least one active layer and a titanium tungsten nitride (TiW(N)) layer (30) on the metal. A method of manufacturing such a semiconductor device is also disclosed.

8 Claims, 1 Drawing Sheet

Figure 1:
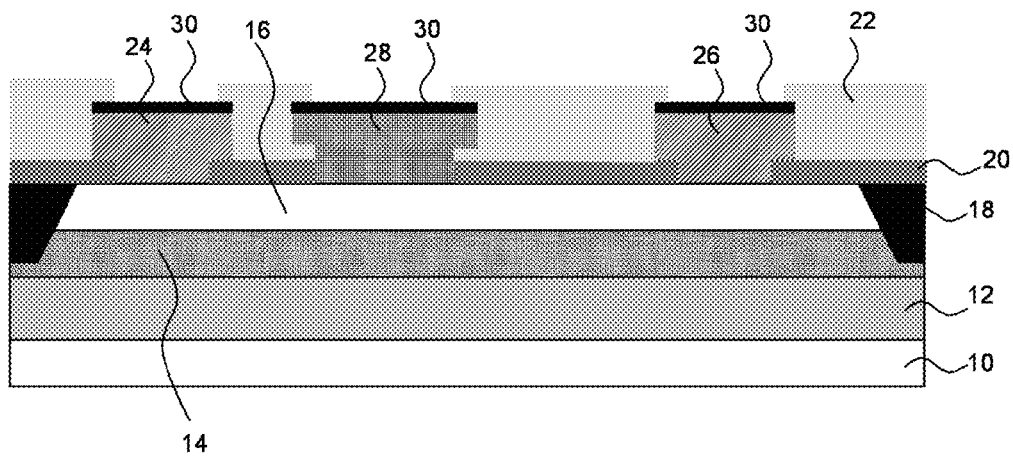

(51) Int. Cl.
*H01L 21/285* (2006.01)
*H01L 29/45* (2006.01)
*H01L 29/47* (2006.01)
*H01L 29/66* (2006.01)
*H01L 29/778* (2006.01)
*H01L 29/20* (2006.01)

(56) References Cited

U.S. PATENT DOCUMENTS

| | | | |
|---|---|---|---|
| 6,011,281 A | 1/2000 | Nunokawa et al. | |
| 6,015,614 A * | 1/2000 | Ruppi | C23C 16/0272 407/119 |
| 6,316,831 B1 * | 11/2001 | Wang | H01L 23/49816 257/737 |
| 8,012,783 B2 | 9/2011 | Takano et al. | |
| 2002/0068435 A1 * | 6/2002 | Tsai | H01L 21/02074 438/637 |
| 2003/0025143 A1 * | 2/2003 | Lin | H01L 28/40 257/303 |
| 2004/0232557 A1 * | 11/2004 | Kim | H01L 21/76807 257/758 |
| 2005/0161765 A1 * | 7/2005 | Tsau | H01L 21/76807 257/528 |
| 2005/0179045 A1 * | 8/2005 | Ryu | H01L 33/32 257/94 |
| 2006/0157735 A1 | 7/2006 | Kanamura et al. | |
| 2007/0012930 A1 * | 1/2007 | Liu | H01L 33/38 257/80 |
| 2007/0155091 A1 * | 7/2007 | Park | H01L 21/7681 438/253 |
| 2007/0291441 A1 * | 12/2007 | Inoue | H01L 23/5223 361/306.2 |
| 2008/0064163 A1 * | 3/2008 | Coolbaugh | H01L 23/5223 438/253 |
| 2008/0122376 A1 * | 5/2008 | Lys | 315/192 |
| 2010/0129978 A1 * | 5/2010 | Kim | H01L 28/91 438/393 |
| 2010/0207157 A1 * | 8/2010 | Schiaffino | H01L 33/0079 257/99 |
| 2011/0001144 A1 * | 1/2011 | Fujikawa | H01L 29/1066 257/77 |
| 2011/0005942 A1 * | 1/2011 | Kohn | G01N 27/414 205/794.5 |
| 2011/0108850 A1 | 5/2011 | Cheng et al. | |
| 2013/0234278 A1 * | 9/2013 | Hagleitner | H01L 29/7786 257/473 |
| 2013/0271938 A1 * | 10/2013 | Lindert | H05K 1/182 361/782 |

FOREIGN PATENT DOCUMENTS

| | | |
|---|---|---|
| EP | 0 631 323 A1 | 12/1994 |
| EP | 2 416 364 A2 | 2/2012 |
| JP | 2011 249827 A | 12/2011 |
| JP | 2011-249828 A | 12/2011 |
| WO | 2010/074964 A2 | 7/2010 |

OTHER PUBLICATIONS

De Jaeger, B. et al. "Au-free CMOS-compatible AlGaN/GaN HEMT Processing on 200 mm Si Substrates", 24th Internl. Symp. on Power Semiconductor Devices and ICs (ISPSD), pp. 49-52 (Jun. 2012).

Fontsere, A. "A HfO2 based 800V/300° C. Au-free AlGaN/GaN-on-Si HEMT Technology", 24th Internl. Symp. on Power Semiconductor Devices and ICs (ISPSD), pp. 37-40 (Jun. 2012).

Chang, P. "GaN Schottky Diode with TiW Electrodes on Silicon Substrate Based on AlN/AlGaN Buffer Layer", J. of Nanomaterials, vol. 2012, Article ID 452310, pp. 1-5 (2012).

Piotrowska, A. et al. "TaSiN~TiSiN and TiWN Diffusion Barriers for Metallization Systems to GaN", Abstract, 2 pgs., retrieved from the Internet Dec. 20, 2013 at: http://www.science24.com/paper/2233 (Jun. 8, 2009).

Kramer, Mark C. J. C. M "Gallium Nitride-based Microwave High-Power Heterostructure Field-Effects Transistors—Design Technology, and Characterization" PHD Thesis, 256 pgs, retrieved from the Internet at: alexandria.tue.nl/extra2/200611998.pdf (2006).

Piotrowska, A. et al. "Anti-diffusion Barriers for Gold-Based Metallizations to p-GaN", Mater. Res. Soc. Symp. Proc., vol. 892, pp. 351-356(Nov. 2005).

Cai, S. J. et al. "High Performance AlGaN/GaN HEMT with Improved Ohmic Contacts", IEEE Electronic Letters, vol. 34, No. 24, pp. 2354-2356 (Nov. 26, 1998).

Ruvimov, S. et al. "Microstructure of Ti/Al Ohmic contacts for n-AlGaN", IEEE Applied Physics Letters, vol. 73, No. 18, pp. 2582-2584 (Nov. 2, 1998).

Liu, Q. Z. et al. "Study of Contact Formation in AlGaN/GaN Heterostructures", IEEE Applied Physics Letters, vol. 71, No. 12, pp. 1658-1660 (Sep. 22, 1997).

Extended European Search Report for EP Patent Appln. No. 13163745.6 (Jan. 14, 2014).

* cited by examiner

SEMICONDUCTOR DEVICE AND MANUFACTURING METHOD

CROSS-REFERENCE TO RELATED APPLICATIONS

This application claims the priority under 35 U.S.C. §119 of European patent application no. 13163745.6, filed on Apr. 15, 2013, the contents of which are incorporated by reference herein.

FIELD OF THE INVENTION

The present invention relates to a semiconductor device comprising at least one active layer such as a GaN layer on a substrate and a first contact to the at least one active layer, the first contact comprising a metal in contact with the at least one active layer.

The present invention further relates to a method of manufacturing such a semiconductor device.

BACKGROUND OF THE INVENTION

Over the last few years III-V nitrides like GaN have drawn a lot of interest as promising materials for high-temperature and high-power electronics. Future high-efficiency power converters require fast switching, low conduction loss devices that can handle high voltages. GaN is a good candidate for voltages up to 1 kV and shows excellent switching behaviour in Schottky diodes and in high-electron mobility transistors (HEMTs). Thanks to the advancements in GaN-on-Si epitaxy, the semiconductor industry is now actively combining III-V specific device expertise with low-cost high-volume Si main-stream production facilities.

One of the key considerations for main-stream Si compatibility is the choice of metals used and as the technology advances, more stringent demands will be made on the reproducibility, uniformity, thermal stability, and high temperature operation of GaN-based semiconductor devices.

Most ohmic contacts on GaN/AlGaN heterostructures are based on Ti/Al-based metallization schemes. Titanium creates nitrogen vacancies in the underlying GaN by forming TiN, which enables electrons to tunnel to the 2-dimensional electron gas (2DEG) underneath the AlGaN. Aluminium is included to react with Ti to prevent oxidation of the Ti. On top of the Al, gold is commonly used as the bulk metal, often separated by a diffusion barrier. Common metallization structures include Ti/Al/Ti/Au, Ti/Al/Ni/Au and Ti/Al/Pt/Au.

However, gold not only is expensive but also is incompatible with mainstream silicon-based semiconductor device manufacturing processes. Therefore, to be able to process GaN/AlGaN HEMTs on GaN-on-Si substrates in a standard Si fab, gold has to be eliminated from the process and replaced by a main-stream Si-compatible metal.

Such semiconductor devices may further or alternatively include a Schottky contact, which may comprise a nickel layer in contact with the at least one active layer of the semiconductor device. This also is not without problems. For instance, when aluminium is used as the metal of choice in the backend, aluminium can diffuse into the nickel, which negatively affects the properties of the Schottky contact.

EP 2 416 364 A2 discloses a GaN-based semiconductor device having a Schottky contact including a first metal contact layer and a second Schottky metal contact layer disposed on the first metal contact layer. The second Schottky metal contact layer has a lower work function than the first metal contact layer. The first metal contact layer preferably includes nickel and the second Schottky metal contact layer may be selected from Pd, TiW interlayer, Pt, Al, Ti, Mo, Au or a combination thereof. However, it has been found that the suggested second Schottky metal contact layer does not satisfactorily address the aforementioned problems.

SUMMARY OF THE INVENTION

The present invention seeks to provide semiconductor device comprising at least one active layer such as a GaN layer on a substrate and a first contact to the at least one active layer, the first contact comprising a metal in contact with the at least one active layer of which at least some of the aforementioned problems have been addressed.

The present invention further seeks to provide a method of manufacturing such a semiconductor device.

According to a first aspect, there is provided a semiconductor device comprising at least one active layer on a substrate and a first contact to the at least one active layer, the first contact comprising a metal in contact with the at least one active layer and a titanium tungsten nitride (TiW(N)) layer on the metal.

It has been found that TiW(N) can improve the characteristics of both ohmic and Schottky contacts in such semiconductor devices due to its thermal properties and barrier properties.

For instance, for a first contact being an ohmic contact in which the metal comprises a Ti/Al interlayer, the TiW(N) layer prevents the melting of the aluminium layer in subsequent anneal processes, whilst at the same time not affecting the Ti/Al ohmic contact formation and adhering well to the Ti/Al interlayer structure without diffusing into this structure. In addition, the TiW(N) layer exhibits a low surface roughness after anneal, which facilitates the formation of reliable (external) contacts to this layer.

For a first contact being a Schottky contact including nickel as the metal, the TiW(N) layer acts as an effective barrier layer preventing the diffusion of aluminium metallization into the nickel. In addition, it has been found that the TiW(N) layer can prevent the delamination of nickel where the first contact is laterally delimited by an electrically insulating material, specifically silicon nitride (SiN).

In an embodiment, the semiconductor device, in addition to the first contact being a Schottky contact, may comprise a further (ohmic) contact spatially separated from the first contact, the further contact comprising a Ti/Al interlayer in contact with the at least one active layer and a titanium tungsten nitride layer on the Ti/Al interlayer. In this embodiment, the aforementioned advantages of the inclusion of a TiW(N) layer in the Schottky contact and the ohmic contact respectively are combined into a single semiconductor device.

In an embodiment, the first contact is a gate contact and the further contact is one of a source and drain contact. Both the source contact and the drain contact may be a respective further contact.

The TiW(N) layer comprises a stack of sublayers including a first TiW sublayer, a second TiW sublayer and a TiW(N) sublayer inbetween the first and second TiW sublayers. This is the resulting structure from a process in which nitrogen is gradually introduced to and removed from the reactants in a reaction chamber of e.g. a sputter deposition tool, which ensures that no nitrogen is present in the reaction chamber to contaminate subsequent sputter targets for which the inclusion of nitrogen is undesirable.

The TiW(N) sublayer preferably has a thickness exceeding the combined thickness of the first and second TiW sublayers such that the properties of the sublayer stack are dominated by the TiW(N) sublayer.

Although the present invention can be applied in any suitable semiconductor device, the present invention is particularly suitable for application in a semiconductor device comprising a gallium nitride (GaN) active layer. An AlGaN layer may separate the GaN layer from the metal layer of the one or more contacts of the semiconductor device.

In accordance with another aspect of the present invention, there is provided a method of manufacturing a semiconductor device, the method comprising providing a substrate; forming at least one active layer on said substrate; and forming a first contact on the at least one active layer by depositing a metal on the at least one active layer; depositing a TiW(N) layer over said metal; and patterning the metal to form the first contact. The TiW(N) layer may for instance be deposited using sputter deposition.

If the metal is nickel, it is preferable that the patterning of the contact is performed after the deposition of the TiW(N) layer as it has surprisingly been found that this effectively protects the nickel layer from delamination in subsequent processing steps.

In an embodiment, the substrate may be a silicon substrate, a SiC substrate or a sapphire substrate and the at least one active layer may comprise a GaN layer and an AlGaN layer over the GaN layer, wherein the step of forming the first contact comprises forming said first contact on the AlGaN layer.

The step of depositing a TiW(N) layer over said metal may comprise depositing a first TiW sublayer over the metal; depositing a TiW(N) sublayer over the first TiW sublayer and depositing a second TiW sublayer over the TiW(N) sublayer.

BRIEF DESCRIPTION OF THE EMBODIMENTS

Figure 2:
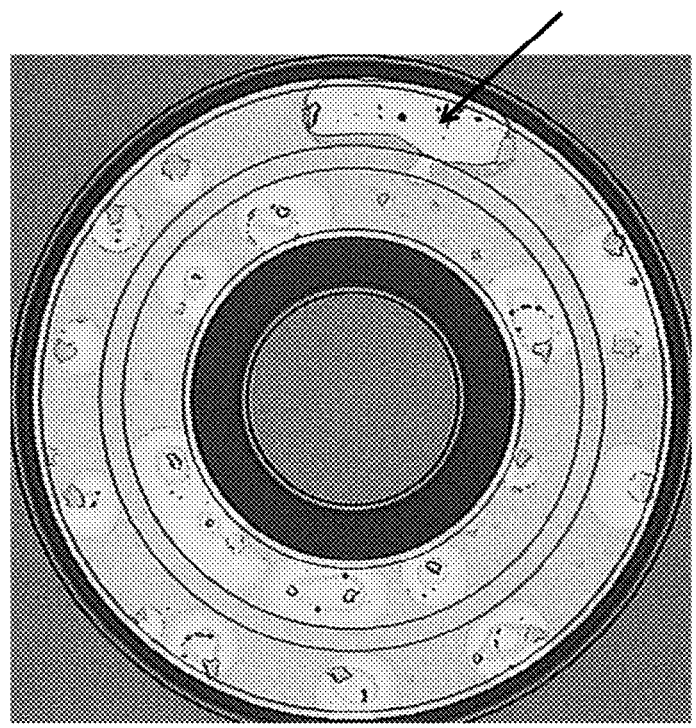

Embodiments of the invention are described in more detail and by way of non-limiting examples with reference to the accompanying drawings, wherein:

FIG. 1 schematically depicts a semiconductor device according to an embodiment of the present invention; and FIG. 2 is an optical image of an aspect of a semiconductor device.

DETAILED DESCRIPTION OF THE DRAWINGS

It should be understood that the Figures are merely schematic and are not drawn to scale. It should also be understood that the same reference numerals are used throughout the Figures to indicate the same or similar parts.

The present invention is based on the realization that titanium tungsten nitride (TiW(N)) can be advantageously used on top of metal contacts, in particular Ti/Al and Ni contacts, to improve the robustness of these contacts to subsequent processing steps in the formation of a semiconductor device, such as a diode, a transistor and so on. Specifically, the application of a TiW(N) layer on such contacts has been found particularly beneficial if subsequent manufacturing steps of the semiconductor device expose the metal contacts to high temperature anneal steps, as will be explained in more detail later. The present invention may be applied to any semiconductor technology, but is particularly advantageous when applied to gallium nitride (GaN)-based semiconductor devices where such thermal anneal steps are commonplace in the manufacturing process. More specifically, the present invention is particularly advantageous when applied to gallium nitride (GaN)-based semiconductor devices where mainstream Si-fab compatibility is required, for example GaN semiconductor devices for use in power, radio frequency (RF) and sensor applications.

FIG. 1 schematically depicts a non-limiting example of such a GaN-based semiconductor device (a HEMT). The semiconductor device comprises a substrate 10, such as a silicon substrate, onto which a buffer layer 12 is formed. The buffer layer 12 may for instance comprise GaN, AlGaN or a combination thereof. The semiconductor device comprises an active layer stack including a GaN layer 14 and an AlGaN layer 16. The semiconductor device may comprise isolation regions 18 to electrically separate adjacent semiconductor devices on a wafer. The isolation regions 18 for instance may be formed in any suitable manner, e.g. by etching a mesa into the active layer stack or by implanting an impurity such as argon into the active layer stack to locally disrupt the crystal structure such that the 2 dimensional electron gas can no longer form in this region. It should be understood that depending on the technology other types of isolation regions 18 may be used, e.g. using any suitable electrically insulating material such as silicon oxide, silicon-rich oxide, silicon nitride and so on.

A passivation layer 20 is formed on the active layer stack, which has been patterned to provide contact regions to the active layer stack. The passivation layer 20 may be any suitable dielectric material, such as silicon nitride. In FIG. 1, the semiconductor device is shown to have three contacts by way of non-limiting example only, namely ohmic contacts 24 and 26 and Schottky contact 28. It should however be understood that the semiconductor device may have any suitable number of contacts, and that it is not necessary that the semiconductor devices includes both ohmic contacts and Schottky contacts. Instead, the semiconductor device may have only ohmic contacts or only Schottky contacts. The contacts 24, 26 and 28 are in conductive contact with the AlGaN layer 16 and are electrically insulated from each other by a dielectric material 22, such as silicon nitride or any other suitable material. In an embodiment, the contacts 24, 26 and 28 are in physical contact with the AlGaN layer 16. In an alternative embodiment, the contacts 24, 26 and 28 are separated from the AlGaN layer 16 by a capping layer to prevent reaction of the AlGaN layer 16 when exposing an intermediate structure to dry or wet etch chemistries, e.g. when forming the openings for the contacts 24, 26 and 28. Such a capping layer should be thin enough to allow the contacts 24, 26 and 28 to be conductively coupled to the AlGaN layer 16. In an embodiment, the capping layer is a GaN layer having a thickness of less than 10 nm, e.g. 2-3 nm. Preferably, the passivation layer 20 and the dielectric material 22 are the same material, such as silicon nitride.

The first ohmic contact 24 may define a source electrode of the semiconductor device, the second ohmic contact 26 may define a drain electrode of the semiconductor device and the Schottky contact 28 may define a gate electrode of the semiconductor device. The first and second ohmic contacts 24, 26 each are typically formed of an metallization stack including a Ti layer in physical contact with the AlGaN layer 16 and an Al layer in physical contact with the Ti layer. Further layers may be present in each of these contacts. In order to obtain a low ohmic contact between the Ti layer and the AlGaN layer 16, a high temperature anneal step, e.g. around 800° C., is typically necessary. However, as these temperatures are above the melting point of aluminium, a capping layer has to be present on the ohmic contacts to prevent the melting of the Al layer in the ohmic contacts.

The Schottky contact 30 typically contains nickel (Ni) as the metal in physical contact with the AlGaN layer 16. The use of Ni is also not straightforward, especially when using aluminium for the metallization of the semiconductor device. For the avoidance of doubt, the term metallization is used to indicate the metal structures on top of the semiconductor device that inter alia facilitate the connection of the contacts 24, 26, 28 to other circuit elements or to the outside world. The process of manufacturing the metallization of a semiconductor device is commonly referred to as the back-end process.

In order to obtain a good Schottky contact between the Ni layer and the AlGaN layer 16, a high temperature anneal step, e.g. around 400-600° C., is typically necessary. However, at these temperatures the aluminium metallization freely diffuses into the nickel contact, such that it is necessary to protect the nickel from the aluminium with a barrier layer.

As will be understood, it is desirable to provide a single solution to the different problems associated with ohmic Ti/Al contacts 24, 26 and Schottky Ni contacts 28 as this minimizes the required number of additional process steps, thus providing a cost-effective solution. In accordance with an aspect of the present invention, such a single solution is provided by the addition of a TiW(N) layer 30 on the ohmic contacts 24, 26 and on the Schottky contact 28. In an embodiment, the nitrogen content of the TiW(N) layer 30 is in the range of 1-30 atom % based on the total atom composition of the TiW(N) layer 30. In another embodiment, the nitrogen content of the TiW(N) layer 30 is in the range of 2-20 atom % based on the total atom composition of the TiW(N) layer 30. In yet another embodiment, the nitrogen content of the TiW (N) layer 30 is in the range of 5-15 atom % based on the total atom composition of the TiW(N) layer 30.

It has been found that for the ohmic contacts 24, 26, the TiW(N) layer 30 does not negatively affect the Ti/Al ohmic contact formation and does not diffuse into the formed Ti/Al intermetallics. It also shows excellent adhesion to such Ti/Al intermetallics as well as low surface roughness after the aforementioned anneal steps, thereby facilitating a high quality contact between the TiW(N) layer 30 and the metallization, e.g. Al metallization. In addition, the TiW(N) layer 30 also shows excellent adhesion to nickel and has proven to effectively prevent the diffusion of Al into nickel during the aforementioned anneal steps.

It is pointed out that apart from the TiW(N) layer 30, the semiconductor device in FIG. 1 is known per se, such that the semiconductor device may be manufactured in any suitable manner known to the skilled person. The TiW(N) layer 30 preferably is deposited onto the contact metals prior to patterning of the contacts 24, 26, 28. Particularly, the metal stacks of the respective contacts 24, 26 and 28 preferably are formed in a single run to avoid any exposure to air, which could cause oxidation. It is further preferred that the TiW(N) layer 30 is deposited immediately prior to this patterning step when depositing the TiW(N) layer 30 on a nickel Schottky contact 28 as will be explained in more detail later.

The TiW(N) layer 30 may be deposited in any suitable manner. A particularly suitable manner is through sputter deposition. In an embodiment, the TiW(N) layer 30 is deposited as a single layer. In a particularly advantageous embodiment, the TiW(N) layer 30 is deposited as a stack of sublayers, in which the TiW(N) sublayer is sandwiched between a lower TiW sublayer and an upper TiW sublayer. As previously explained, this purges the reaction chamber of the sputtering device of residual nitrogen, such that subsequent sputter targets are not contaminated with residual nitrogen. Each of these sublayers may be deposited using sputter deposition or any other suitable deposition technique. It should however be understood that the technical problems addressed by the present invention may equally be solved using a TiW(N) layer 30 only, i.e. without the lower TiW sublayer and the upper TiW sublayer.

In an embodiment, the TiW(N) sublayer preferably is thicker than each of the TiW sublayers and preferably thicker than the TiW sublayers combined. For instance, in a current 4" silicon wafer process, the TiW sublayers have a thickness of 10 nm and the TiW(N) sublayer has a thickness of 80 nm to ensure that the bulk behavior of the layer stack 30 is dominated by the properties of the TiW(N) sublayer.

FIG. 2 is an optical micrograph of a circular Schottky Barrier Diode, showing delamination of Ni at the interfaces with silicon nitride. One such delamination area is indicated by the arrow. Without wishing to be bound by theory, it is believed that the delamination of Ni takes place mainly due to the diffusion of hydrogen through Ni. A large amount of atomic hydrogen is present during the plasma enhanced chemical vapour deposition (PECVD) of the silicon nitride intermetal dielectric 22, which is believed to lead to recombination at the interfaces of Ni to silicon nitride. In addition, PECVD silicon nitrides are known to contain a high amount of hydrogen bound to nitrogen. At subsequent anneal steps, H—N bonds can be broken, which again can lead to diffusion of hydrogen through the Ni Schottky contact 28. Although the former hydrogen diffusion process probably is more dominant, both sources of atomic hydrogen and the subsequent formation of $H_2$ are believed to be the driving force behind delamination.

If a hydrogen diffusion barrier is applied between the silicon nitride hydrogen source and the Ni metal layer, delamination of Ni from silicon nitride is prevented. It has surprisingly been found that a TiW(N) barrier layer 30 deposited directly on the Ni of the Schottky contact 28 prior to patterning of the Schottky gate has been proven to be very effective in suppressing such delamination.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The invention can be implemented by means of hardware comprising several distinct elements. In the device claim enumerating several means, several of these means can be embodied by one and the same item of hardware. The mere fact that certain measures are recited in mutually different dependent claims does not indicate that a combination of these measures cannot be used to advantage.

The invention claimed is:

1. A semiconductor device comprising at least one active layer on a substrate and a first contact to the at least one active layer, the first contact comprising a metal in contact with the at least one active layer and a titanium tungsten nitride (TiW (N)) layer on the metal,
wherein the metal is nickel,
wherein the first contact is laterally delimited by an electrically insulating material,
wherein the semiconductor device comprises a further contact that is entirely laterally separated from the first contact by the electrically insulating material such that the first contact and the further contact are electrically insulated from each other, the further contact comprising a Ti/Al metallization stack in contact with the at least one active layer and a TiW(N) layer on the Ti/Al metallization stack,
wherein the first contact is a Schottky contact and the further contact is an ohmic contact.

2. The semiconductor device of claim 1, wherein the at least one active layer comprises a GaN layer.

3. The semiconductor device of claim 2, wherein the GaN layer is separated from the at least one contact by an AlGaN layer.

4. The semiconductor device of claim 1, wherein the electrically insulating material is SiN.

5. The semiconductor device of claim 1, wherein the TiW(N) layer comprises a stack of sublayers including a first TiW sublayer, a second TiW sublayer and a TiW(N) sublayer inbetween the first and second TiW sublayers, and wherein the TiW(N) sublayer preferably has a thickness exceeding the combined thickness of the first and second TiW sublayers.

6. A semiconductor device comprising at least one active layer on a substrate and a first contact to the at least one active layer, the first contact comprising a metal in contact with the at least one active layer and a titanium tungsten nitride (TiW(N)) layer on the metal,
wherein the metal is nickel,
wherein the first contact is laterally delimited by an electrically insulating material,
wherein the semiconductor device comprises a further contact that is entirely laterally separated from the first contact by the electrically insulating material such that the first contact and the further contact are electrically insulated from each other, the further contact comprising a Ti/Al metallization stack in contact with the at least one active layer and a TiW(N) layer on the Ti/Al metallization stack,
wherein the first contact is a gate contact and the further contact is one of a source and drain contact.

7. A semiconductor device comprising:
a substrate;
at least one active layer on the substrate;
a gate contact connected to the at least one active layer, the gate contact comprising nickel and having a titanium tungsten nitride (TiW(N)) layer on top of the nickel and opposite the at least one active layer;
a source contact connected to the at least one active layer, the source contact comprising a Ti/Al metallization stack with a Ti layer in physical contact with the at least one active layer and an Al layer in physical contact with the Ti layer and a TiW(N) layer on the Ti layer of the Ti/Al metallization stack and opposite the at least one active layer;
a drain contact connected to the at least one active layer, the drain contact comprising a Ti/Al metallization stack with a Ti layer in physical contact with the at least one active layer and an Al layer in physical contact with the Ti layer and a TiW(N) layer on the Ti layer of the Ti/Al metallization stack and opposite the at least one active layer;
wherein the source contact and the drain contact are entirely laterally separated from the gate contact by an electrically insulating material such that the source contact, the drain contact, and the gate contact are electrically insulated from each other.

8. A high-electron mobility transistor (HEMT) comprising the semiconductor device of claim 7.

* * * * *